United States Patent
Xu et al.

(10) Patent No.: US 12,225,767 B2
(45) Date of Patent: Feb. 11, 2025

(54) ARRAY SUBSTRATE, METHOD FOR MANUFACTURING THE SAME, DISPLAY PANEL AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Yuanjie Xu, Beijing (CN); Yue Long, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 480 days.

(21) Appl. No.: 17/535,146

(22) Filed: Nov. 24, 2021

(65) Prior Publication Data
US 2022/0293692 A1 Sep. 15, 2022

(30) Foreign Application Priority Data
Mar. 15, 2021 (CN) .......................... 202110278051.0

(51) Int. Cl.
*H10K 59/121* (2023.01)
*H10K 59/12* (2023.01)
*H10K 59/131* (2023.01)
*H10K 59/65* (2023.01)
*H10K 71/00* (2023.01)

(52) U.S. Cl.
CPC ......... *H10K 59/121* (2023.02); *H10K 59/131* (2023.02); *H10K 59/65* (2023.02); *H10K 71/00* (2023.02); *H10K 59/1201* (2023.02)

(58) Field of Classification Search
CPC .................................................... H10K 59/131
See application file for complete search history.

(56) References Cited

U.S. PATENT DOCUMENTS

| | | | |
|---|---|---|---|
| 11,036,325 B2 * | 6/2021 | Lee .................... | H10K 50/84 |
| 2017/0345882 A1 * | 11/2017 | Nam ................... | H10K 59/124 |
| 2021/0083013 A1 * | 3/2021 | Bang ................... | H10K 50/84 |
| 2021/0286456 A1 * | 9/2021 | Jo ......................... | G06F 3/0446 |
| 2022/0066613 A1 * | 3/2022 | Yuan .................... | H10K 59/124 |
| 2022/0246649 A1 * | 8/2022 | Liang ................... | H10K 71/00 |
| 2024/0040857 A1 * | 2/2024 | Peng .................... | H10K 59/123 |

* cited by examiner

*Primary Examiner* — Mounir S Amer
(74) *Attorney, Agent, or Firm* — IPro, PLLC

(57) ABSTRACT

The present disclosure provides an array substrate, a method for manufacturing the array substrate, a display panel and a display device. A display region of the array substrate includes an opening region. The array substrate includes a base substrate, a driving circuitry structure and an anode layer. The driving circuitry structure includes a transparent conductive layer for forming a transparent line, and an active layer and a plurality of metal layers for forming a plurality of pixel driving circuitries, and the transparent conductive layer is laminated on and in contact with the active layer and/or one metal layer. The anode layer includes a plurality of anodes, and each anode arranged at the opening region is electrically coupled to a corresponding pixel driving circuitry via the transparent line.

19 Claims, 9 Drawing Sheets

ARRAY SUBSTRATE, METHOD FOR MANUFACTURING THE SAME, DISPLAY PANEL AND DISPLAY DEVICE

CROSS-REFERENCE TO RELATED APPLICATION

This application claims a priority of the Chinese patent application No. 202110278051.0 filed on Mar. 15, 2021, which is incorporated herein by reference in its entirety.

TECHNICAL FIELD

The present disclosure relates to the field of display technology, in particular to an array substrate, a method for manufacturing the array substrate, a display panel and a display device.

BACKGROUND

For a full-screen, bezel-free display product (such as a mobile phone), a screen covers an entire front surface of the display product, so as to achieve a screen-to-body ratio of approximately 100%. In this way, it is able to improve the appearance of the mobile phone and provide a sense of technology. In addition, it is able to provide the mobile phone with a larger screen, so as to significantly improve the visual experience. An under-screen camera technology is one of the key technologies for a full-screen product. Currently, as one scheme for an under-screen camera, a light-transmitting effect of a region where the under-screen camera is increased, so that more ambient light is collected by the under-screen camera to achieve an excellent imaging effect.

SUMMARY

In one aspect, the present disclosure provides in some embodiments an array substrate, including a display region including an opening region. The array substrate includes: a base substrate; a driving circuitry structure including a transparent conductive layer for forming a transparent line, and an active layer and a plurality of metal layers for forming a plurality of pixel driving circuitries, the transparent conductive layer being laminated on and in contact with the active layer, and/or the transparent conductive layer being laminated on and in contact with one metal layer; and an anode layer arranged at a side of the driving circuitry structure away from the base substrate and including a plurality of anodes, each anode arranged at the opening region being electrically coupled to a corresponding pixel driving circuitry via the transparent line.

In a possible embodiment of the present disclosure, the plurality of metal layers includes a first gate metal layer arranged at a side of the active layer away from the base substrate, a second gate metal layer arranged at a side of the first gate metal layer away from the active layer, a first source/drain metal layer arranged at a side of the second gate metal layer away from the first gate metal layer, and a second source/drain metal layer arranged at a side of the first source/drain metal layer away from the second gate metal layer. The driving circuitry structure further includes a first insulation layer arranged between the active layer and the first gate metal layer, a second insulation layer arranged between the first gate metal layer and the second gate metal layer, a third insulation layer arranged between the second gate metal layer and the first source/drain metal layer, a fourth insulation layer arranged between the first source/drain metal layer and the second source/drain metal layer, and a fifth insulation layer arranged between the second source/drain metal layer and the anode layer.

In a possible embodiment of the present disclosure, each pixel driving circuitry includes a driving transistor, the first source/drain metal layer includes a drain electrode of the driving transistor in electrical contact with the active layer, and the anode at the opening region is electrically coupled to the drain electrode of the driving transistor or the active layer of the corresponding pixel driving circuitry via the transparent line. The at least one transparent conductive layer includes a first transparent conductive layer arranged between the first gate metal layer and the first insulation layer, and/or a second transparent conductive layer arranged between the second gate metal layer and the second insulation layer, and/or a third transparent conductive layer arranged between the second source/drain metal layer and the fourth insulation layer. The first transparent conductive layer includes a first transparent line, the second transparent conductive layer includes a second transparent line, and the third transparent conductive layer includes a third transparent line. The transparent line includes one or more of the first transparent line, the second transparent line and the third transparent line.

In a possible embodiment of the present disclosure, the first gate metal layer is arranged at a side of the first transparent conductive layer away from the base substrate, the second gate metal layer is arranged at a side of the second transparent conductive layer away from the base substrate, and the second source/drain metal layer is arranged at a side of the third transparent conductive layer away from the base substrate.

In a possible embodiment of the present disclosure, the display region further includes a non-opening region surrounding the opening region, and an area of an anode at the non-opening region is greater than an area of an anode at the opening region.

In a possible embodiment of the present disclosure, the pixel driving circuitries include a plurality of first pixel driving circuitries and a plurality of second pixel driving circuitries arranged at the non-opening region, each anode at the non-opening region is electrically coupled to one first pixel driving circuitry, and each anode at the opening region is electrically coupled to one second pixel driving circuitry via the transparent line.

In a possible embodiment of the present disclosure, the first gate metal layer includes a first lapping structure and a second lapping structure each in electrical contact with the first transparent line, the first source/drain metal layer further includes a fifth lapping structure, the drain electrode of the driving transistor is in contact with the first lapping structure, and the fifth lapping structure is electrically coupled to the anode and the second lapping structure. Or, the second gate metal layer includes a third lapping structure and a fourth lapping structure each in electrical contact with the second transparent line, the third lapping structure is further in contact with the drain electrode of the driving transistor, and the fourth lapping structure is electrically coupled to the anode. Or, the second source/drain metal layer includes a sixth lapping structure, the sixth lapping structure and the anode are in electrical contact with the third transparent line, and the sixth lapping structure is electrically coupled to the drain electrode of the driving transistor.

In a possible embodiment of the present disclosure, orthogonal projections of the first lapping structure and the second lapping structure onto the base substrate fall within an orthogonal projection of the first transparent line onto the base substrate, orthogonal projections of the third lapping structure and the fourth lapping structure onto the base substrate fall within an orthogonal projection of the second transparent line onto the base substrate, and orthogonal projections of the sixth lapping structure and the anode onto the base substrate fall within an orthogonal projection of the third transparent line onto the base substrate.

In a possible embodiment of the present disclosure, the display region further includes a non-opening region surrounding the opening region, the array substrate further includes a bezel region surrounding the display region, the pixel driving circuitries include a plurality of first pixel driving circuitries arranged at the non-opening region and a plurality of second pixel driving circuitries arranged at the bezel region, each anode at the non-opening region is electrically coupled to one first pixel driving circuitry, and each anode at the opening region is electrically coupled to one second pixel driving circuitry via the transparent line.

In a possible embodiment of the present disclosure, the at least one transparent conductive layer further includes a fourth transparent conductive layer arranged between the base substrate and the active layer and including a fourth transparent line, the transparent line includes one or more of the first transparent line, the second transparent line, the third transparent line and the fourth transparent line, a plurality of transparent lines in the first transparent line, the second transparent line, and the third transparent line and the fourth transparent line is electrically coupled to each other through a via-hole to form the transparent line.

In a possible embodiment of the present disclosure, an anode spaced apart from a corresponding second pixel driving circuitry at the bezel region by a distance d1 is electrically coupled to the second pixel driving circuitry through the first transparent conductive layer laminated on and in contact with the first gate metal layer, an anode spaced apart from a corresponding second pixel driving circuitry at the bezel region by a distance d2 is electrically coupled to the second pixel driving circuitry through the second transparent conductive layer laminated on and in contact with the second gate metal layer, and an anode spaced apart from a corresponding third pixel driving circuitry at the bezel region by a distance d3 is electrically coupled to the second pixel driving circuitry through the third transparent conductive layer laminated on and in contact with the second source/drain metal layer, where $d1<d2<d3$.

In another aspect, the present disclosure provides in some embodiments a display panel including the above-mentioned array substrate.

In yet another aspect, the present disclosure provides in some embodiments a display device, including the above-mentioned display panel and an image collector. An orthogonal projection of the image collector onto the display panel is located at the opening region.

In still yet another aspect, the present disclosure provides in some embodiments a method for manufacturing an array substrate. The array substrate includes a driving circuitry structure, and the driving circuitry structure includes at least one transparent conductive layer for forming a transparent line, and an active layer and a plurality of metal layers for forming a plurality of pixel driving circuitries, the array substrate includes a display region, and the display region includes an opening region. The method includes: providing a base substrate; patterning a transparent conductive material layer and an active material layer on the base substrate through a same mask to form the transparent conductive layer and the active layer laminated one on another and in contact with each other, and/or patterning the transparent conductive material layer and a metal material layer on the base substrate through a same mask to form the transparent conductive layer and the metal layer laminated one on another and in contact with each other; and forming an anode material layer at a side of the driving circuitry structure away from the base substrate, and patterning the anode material layer to obtain a plurality of anodes. Each anode at the opening region is electrically coupled to a corresponding pixel driving circuitry via the transparent line.

In a possible embodiment of the present disclosure, the plurality of metal layers includes a first gate metal layer, a second gate metal layer, a first source/drain metal layer and a second source/drain metal layer laminated one on another on the base substrate in a direction from the base substrate to the anode layer. Each pixel driving circuitry includes a driving transistor, the first source/drain metal layer includes a drain electrode of the driving transistor in electrical contact with the active layer, and each anode at the opening region is electrically coupled to the drain electrode of the driving transistor or the active layer of the corresponding pixel driving circuitry via the transparent line. The at least one transparent conductive layer includes a first transparent conductive layer laminated on and in contact with the first gate metal layer, and/or a second transparent conductive layer laminated on and in contact with the second gate metal layer, and/or a third transparent conductive layer laminated on and in contact with the second source/drain metal layer. The first transparent conductive layer includes a first transparent line, the second transparent conductive layer includes a second transparent line, and the third transparent conductive layer includes a third transparent line. The transparent line includes one or more of the first transparent line, the second transparent line and the third transparent line.

In a possible embodiment of the present disclosure, the patterning the transparent conductive material layer and the metal material layer on the base substrate through the same half-tone mask to form the transparent conductive layer and the metal layer laminated one on anther and in contact with each other includes: forming the transparent conductive material layer and the metal material layer sequentially on the base substrate; and patterning the transparent conductive material layer and the metal material layer through a same half-tone mask by using a stepwise etching process, so as to form the transparent conductive layer and the metal layer laminated one on another and in contact with each other.

In a possible embodiment of the present disclosure, the display region further includes a non-opening region surrounding the opening region, and an area of an anode at the non-opening region is greater than an area of an anode at the opening region.

In a possible embodiment of the present disclosure, the pixel driving circuitries include a plurality of first pixel driving circuitries and a plurality of second pixel driving circuitries arranged at the non-opening region, each anode at the non-opening region is electrically coupled to one first pixel driving circuitry, and each anode at the opening region is electrically coupled to one second pixel driving circuitry via the transparent line.

In a possible embodiment of the present disclosure, the display region further includes a non-opening region surrounding the opening region, the array substrate further includes a bezel region surrounding the display region, the pixel driving circuitries include a plurality of first pixel driving circuitries arranged at the non-opening region and a plurality of second pixel driving circuitries arranged at the bezel region, each anode at the non-opening region is electrically coupled to one first pixel driving circuitry, and each anode at the opening region is electrically coupled to one second pixel driving circuitry via the transparent line.

In a possible embodiment of the present disclosure, the patterning the transparent conductive material layer and the active material layer on the base substrate through the same mask to form the transparent conductive layer and the active layer laminated one on another and in contact with each other includes: depositing a fourth transparent conductive material layer and the active material layer sequentially on the base substrate; and patterning the active material layer and the fourth transparent conductive material layer through a same half-tone mask by using a stepwise etching process to form the transparent conductive layer and the active layer laminated one on another and in contact with each other. The patterned transparent conductive layer includes a fourth transparent line, the transparent line includes one or more of the first transparent line, the second transparent line, the third transparent line and the fourth transparent line, a plurality of transparent lines in the first transparent line, the second transparent line, the third transparent line and the fourth transparent line is electrically coupled to each other via a via-hole to form the transparent line.

The other aspects and the advantages of the present disclosure will be given as follows, or will become more apparent, or will be understood through practices.

BRIEF DESCRIPTION OF THE DRAWINGS

The above and/or the other aspects and advantages of the present disclosure will become more apparent and understandable in conjunction with the drawings and the embodiments, and in these drawings.

DETAILED DESCRIPTION

Figure 1:
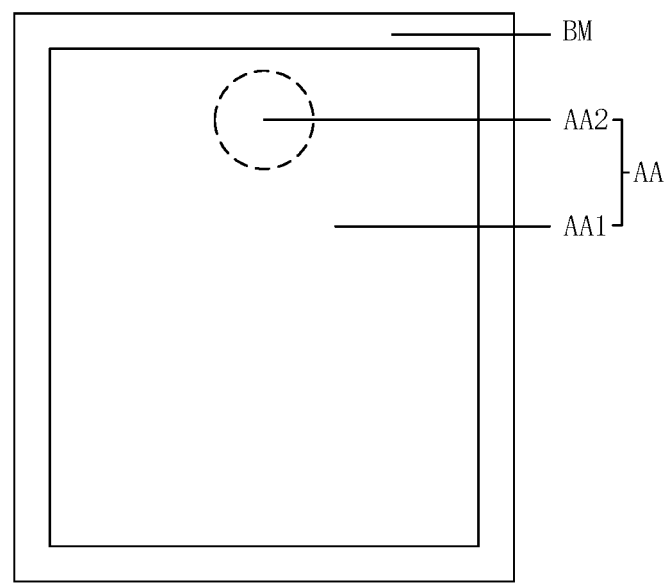
FIG. 1 is a top view of an array substrate according to one embodiment of the present disclosure.

The present disclosure will be described hereinafter in conjunction with the embodiments and the drawings. Identical or similar reference numbers in the drawings represent an identical or similar element or elements having an identical or similar function. In addition, the detailed description about any known technology, which is unnecessary to the features in the embodiments of the present disclosure, will be omitted. The following embodiments are for illustrative purposes only, but shall not be used to limit the scope of the present disclosure.

Unless otherwise defined, any technical or scientific term used herein shall have the common meaning understood by a person of ordinary skills. Any term defined in a commonly-used dictionary shall be understood as having the meaning in conformity with that in the related art, shall not be interpreted idealistically and extremely.

It should be appreciated that, unless otherwise defined, such words as "one" or "one of" are merely used to represent the existence of at least one member, rather than to limit the number thereof. Such words as "include" or "including" intend to indicate that there are the features, integers, steps, operations, elements and/or assemblies, without excluding the existence or addition of one or more other features, integers, steps, operations, elements, assemblies and/or combinations thereof.

An under-screen camera technology is one of the key technologies for a full-screen product. Currently, as one scheme for an under-screen camera, a light-transmitting effect of a region where the under-screen camera is increased, so that more ambient light is collected by the under-screen camera to achieve an excellent imaging effect. However, in order to ensure the light-transmitting effect of an opening region in the case of a high Pixel Per Inch (PPI), usually anodes at the opening region are electrically coupled to pixel driving circuitries through multiple transparent conductive layers. In the related art, these transparent conductive layers are usually arranged between a second source/drain metal layer and an anode layer. Not only these transparent conductive layers but also additional insulation layers (between the transparent conductive layers, between the transparent conductive layer and the anode layer, and between the transparent conductive layer and the second source/drain metal layer) need to be patterned through masks. For example, when three transparent conductive layers are adopted, six additional masks are required, resulting in a significant increase in the manufacture cost as well as a prolonged production takt.

An object of the present disclosure is to provide an array substrate, a method for manufacturing the array substrate, a display panel and a display device, so as to solve the above-mentioned problems.

The present disclosure provides in some embodiments an array substrate which, as shown in FIGS. 1 to 7, includes a display region AA, and the display region AA includes an opening region AA2. The array substrate includes a base substrate 1, a driving circuitry structure 2 and an anode layer 3. To be specific, the base substrate 1 is a rigid substrate, e.g., a glass substrate, or a flexible substrate, e.g., a Polyimide (PI) substrate.

The driving circuitry structure 2 includes a transparent conductive layer (e.g., Indium Tin Oxide (ITO)) for forming a transparent line L, and an active layer 201 and a plurality of metal layers for forming a plurality of pixel driving circuitries T. The transparent conductive layer ITO is laminated on and in contact with the active layer 201, and/or the transparent conductive layer ITO is laminated on and in contact with one metal layer.

The anode layer 3 is arranged at a side of the driving circuitry structure 2 away from the base substrate 1, and includes a plurality of anodes 301. Each anode 301 at the opening region AA2 is electrically coupled to a corresponding pixel driving circuitry T via the transparent line L.

It should be appreciated that, when one film layer is laminated on and in contact with the other film layer, it means that one film layer is formed on the base substrate (e.g., through a deposition process) and then the other film layer is formed on the one film layer (e.g., through a deposition process), and then, the two film layers are patterned through a same mask (e.g., a half-tone mask). For example, a film layer A is laminated on and in contact with a film layer B, i.e., the film layer A and the film layer B are sequentially deposited on the base substrate, and then, the film layer A and the film layer B are patterned through a same half-tone mask, e.g., etched through a stepwise etching process. In other words, the film layer A and the film layer B are etched through a dry-etching process to obtain a pattern where the film layer A overlaps the film layer B, and then a part of the film layer B arranged above the film layer A (at a side away from the base substrate) and not to be reserved is removed through a wet-etching process.

According to the array substrate in the embodiments of the present disclosure, the transparent line L through which each anode 301 at the opening region AA2 is electrically coupled to the corresponding pixel driving circuitry T is laminated on and in contact with the active layer 201 and/or the metal layer, so that the transparent line L and the active layer 201 and/or the metal layer are patterned through a same mask. As a result, it is able to reduce the quantity of masks, thereby to reduce the manufacture cost as well as the production takt.

Figure 4:
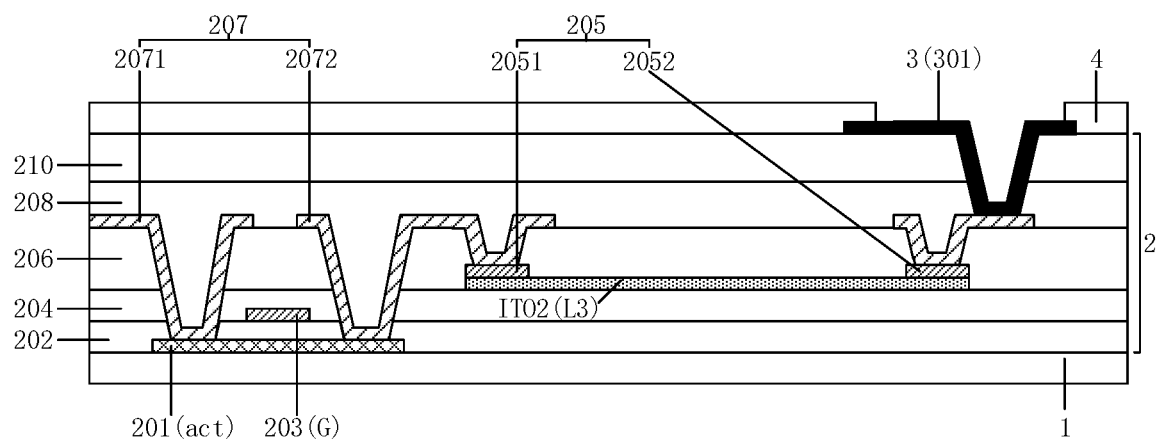
FIG. 4 is another schematic view showing the film layers of the array substrate according to one embodiment of the present disclosure.

In a possible embodiment of the present disclosure, as shown in FIG. 4, the plurality of metal layers includes a first gate metal layer 203 arranged at a side of the active layer 201 away from the base substrate 1, a second gate metal layer 205 arranged at a side of the first gate metal layer 203 away from the active layer 201, a first source/drain metal layer 207 arranged at a side of the second gate metal layer 205 away from the first gate metal layer 203, and a second source/drain metal layer 209 arranged at a side of the first source/drain metal layer 207 away from the second gate metal layer 205.

The driving circuitry structure 2 further includes a first insulation layer 202 arranged between the active layer 201 and the first gate metal layer 203, a second insulation layer 204 arranged between the first gate metal layer 203 and the second gate metal layer 205, a third insulation layer 206 arranged between the second gate metal layer 205 and the first source/drain metal layer 207, a fourth insulation layer 208 arranged between the first source/drain metal layer 207 and the second source/drain metal layer 209, and a fifth insulation layer 210 arranged between the second source/drain metal layer 209 and the anode layer 3.

It should be appreciated that, in the embodiments of the present disclosure, the array substrate further includes a pixel definition layer 4 for defining a light-emitting region and a dark region, which will not be particularly defined herein.

It should be further appreciated that, in the embodiments of the present disclosure, the first insulation layer 202 to the fifth insulation layer 210 may be made of different materials. To be specific, depending on the requirement on dielectric performance, materials and thicknesses of the first insulation layer 202 to the fifth insulation layer 210 are adjusted. In addition, a part of the insulation layers also serve as planarization layers.

In a possible embodiment of the present disclosure, as shown in FIGS. 2 to 5 and 7, each pixel driving circuitry T includes a driving transistor, the first source/drain metal layer 207 includes a drain electrode of the driving transistor in electrical contact with the active layer, and the anode 301 at the opening region AA2 is electrically coupled to the drain electrode of the driving transistor or the active layer 301 of the corresponding pixel driving circuitry T via the transparent line L. The at least one transparent conductive layer ITO includes a first transparent conductive layer ITO1 laminated on and in contact with the first gate metal layer 203, and/or a second transparent conductive layer ITO2 laminated on and in contact with the second gate metal layer 205, and/or a third transparent conductive layer ITO3 laminated on and in contact with the second source/drain metal layer 209. The first transparent conductive layer ITO1 includes a first transparent line L1, the second transparent conductive layer ITO2 includes a second transparent line L2, and the third transparent conductive layer ITO3 includes a third transparent line L3. The transparent line L includes one or more of the first transparent line L1, the second transparent line L2 and the third transparent line L3.

In some embodiments of the present disclosure, the transparent conductive layer ITO is arranged below the metal layer (i.e., at a side of the metal layer adjacent to the base substrate), or above the metal layer (i.e., at a side of the metal layer away from the base substrate), which will not be particularly defined herein.

In some embodiments of the present disclosure, the first gate metal layer is arranged at a side of the first transparent conductive layer away from the base substrate, the second gate metal layer is arranged at a side of the second transparent conductive layer away from the base substrate, and the second source/drain metal layer is arranged at a side of the third transparent conductive layer away from the base substrate.

The array substrate in the embodiments of the present disclosure is adapted to a scheme of reducing an area of the anode 301 at the opening region AA2. The anode 301 at the opening region AA2 is electrically coupled to the drain electrode of the driving transistor of the corresponding pixel driving circuitry T through the transparent line L, so it is able for the anode 301 at the opening region AA2 to be electrically coupled to the corresponding pixel driving circuitry T. In addition, the transparent line L is formed through one or more transparent conductive layers ITO depending on the requirement on the PPI, and when a plurality of transparent conductive layers ITO is adopted, it is able to increase the PPI. The transparent conductive layer ITO is laminated on and in contact with the metal layer, and they may be etched through a same mask, i.e., no additional mask is required, so it is able to control the manufacture cost.

Depending on a film layer structure of the array substrate in the embodiments of the present disclosure, the light-transmitting effect of the opening region AA2 is ensured in different ways.

Figure 2:
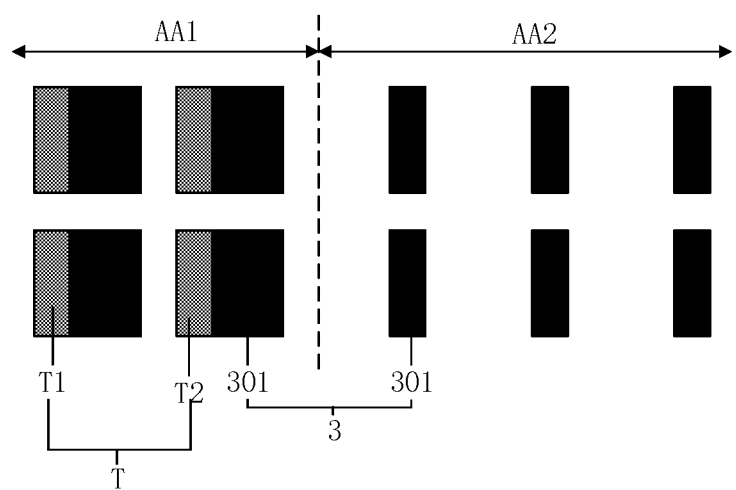
FIG. 2 is a schematic view showing the distribution of anodes and pixel driving circuitries of the array substrate according to one embodiment of the present disclosure.

In a possible embodiment of the present disclosure, as shown in FIG. 2, the display region further includes a non-opening region AA1 (or normal display region) surrounding the opening region, and an area of each anode 301 at the non-opening region AA1 is greater than an area of the anode 301 at the opening region AA2.

In a possible embodiment of the present disclosure, the pixel driving circuitries T include a plurality of first pixel driving circuitries T1 and a plurality of second pixel driving circuitries T2 arranged at the non-opening region AA1, each anode 301 at the non-opening region AA1 is electrically coupled to one first pixel driving circuitry T1, and each anode 301 at the opening region AA2 is electrically coupled to one second pixel driving circuitry T2 via the transparent line L.

In the embodiments of the present disclosure, through reducing the area of the anode 301 at the opening region AA2, i.e., reducing an area of a pixel at the opening region AA2, it is able to ensure an area of a light-transmitting region of the opening region AA2, thereby to meet the light-transmitting requirement on the opening region AA2.

Based on the above scheme for reducing the area of the pixel at the opening region AA2, it is able for the anode 301 at the opening region AA2 to be electrically coupled to the corresponding second pixel driving circuitry 2T in different ways, which will be described hereinafter in details.

Figure 3:
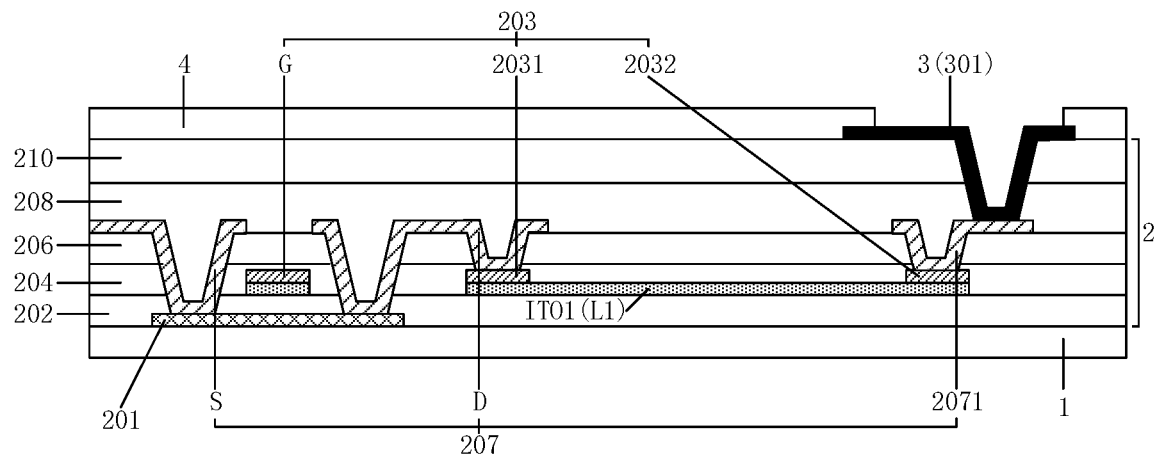
FIG. 3 is a schematic view showing film layers of the array substrate according to one embodiment of the present disclosure.

In a possible embodiment of the present disclosure, as shown in FIG. 3, the first gate metal layer 203 includes a first lapping structure 2031 and a second lapping structure 2032 each in electrical contact with the first transparent line L1, the first source/drain metal layer 207 further includes a fifth lapping structure 2071, the drain electrode of the driving transistor is in contact with the first lapping structure 2031, and the fifth lapping structure 2071 is electrically coupled to the anode 301 and the second lapping structure 2032.

To be specific, the first source/drain metal layer 207 further includes a source electrode S, a data line and drain electrodes of other transistors in the pixel driving circuitries T.

To be specific, the first transparent conductive layer ITO1 further includes portions coinciding with a gate electrode and a gate line at the first gate metal layer 203.

In another possible embodiment of the present disclosure, as shown in FIG. 4, the second gate metal layer 205 includes a third lapping structure 2051 and a fourth lapping structure 2052 each in electrical contact with the second transparent line L2, the third lapping structure 2051 is further in contact with the drain electrode D of the driving transistor, and the fourth lapping structure 2052 is electrically coupled to the anode 301.

Figure 5:
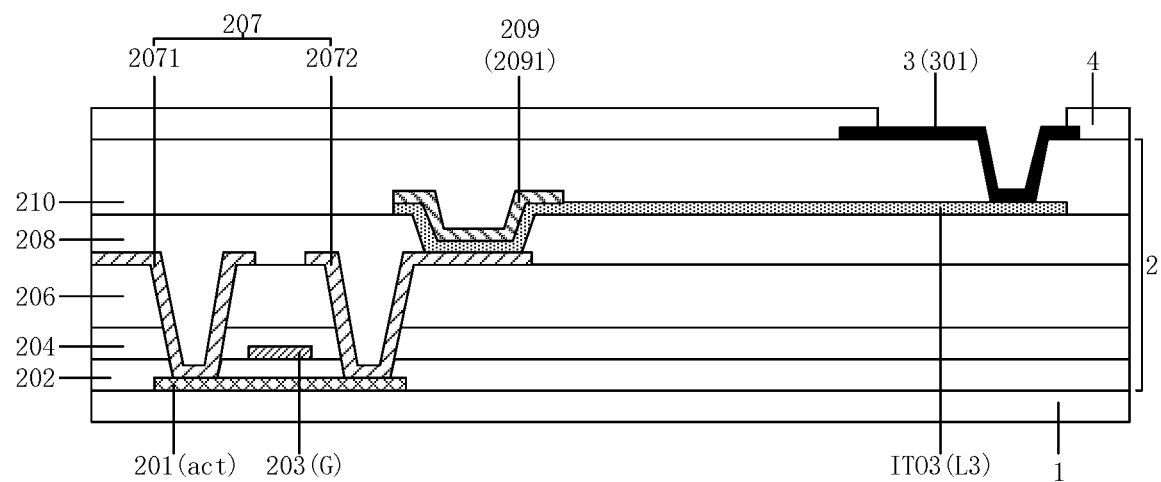
FIG. 5 is yet another schematic view showing the film layers of the array substrate according to one embodiment of the present disclosure.

In yet another possible embodiment of the present disclosure, as shown in FIG. 5, the second source/drain metal layer 209 includes a sixth lapping structure 2091, the sixth lapping structure 2091 and the anode 301 are in electrical contact with the third transparent line L3, and the sixth lapping structure 2091 is electrically coupled to the drain electrode of the driving transistor.

It should be appreciated that, the above schemes may be applied to different array substrates or a same array substrate. When the above schemes are applied to the same array substrate, it is able to provide the transparent lines at a large density, thereby to increase the PPI for display.

In some embodiments of the present disclosure, orthogonal projections of the first lapping structure and the second lapping structure onto the base substrate fall within an orthogonal projection of the first transparent line onto the base substrate, orthogonal projections of the third lapping structure and the fourth lapping structure onto the base substrate fall within an orthogonal projection of the second transparent line onto the base substrate, and orthogonal projections of the sixth lapping structure and the anode onto the base substrate fall within an orthogonal projection of the third transparent line onto the base substrate.

Figure 6:
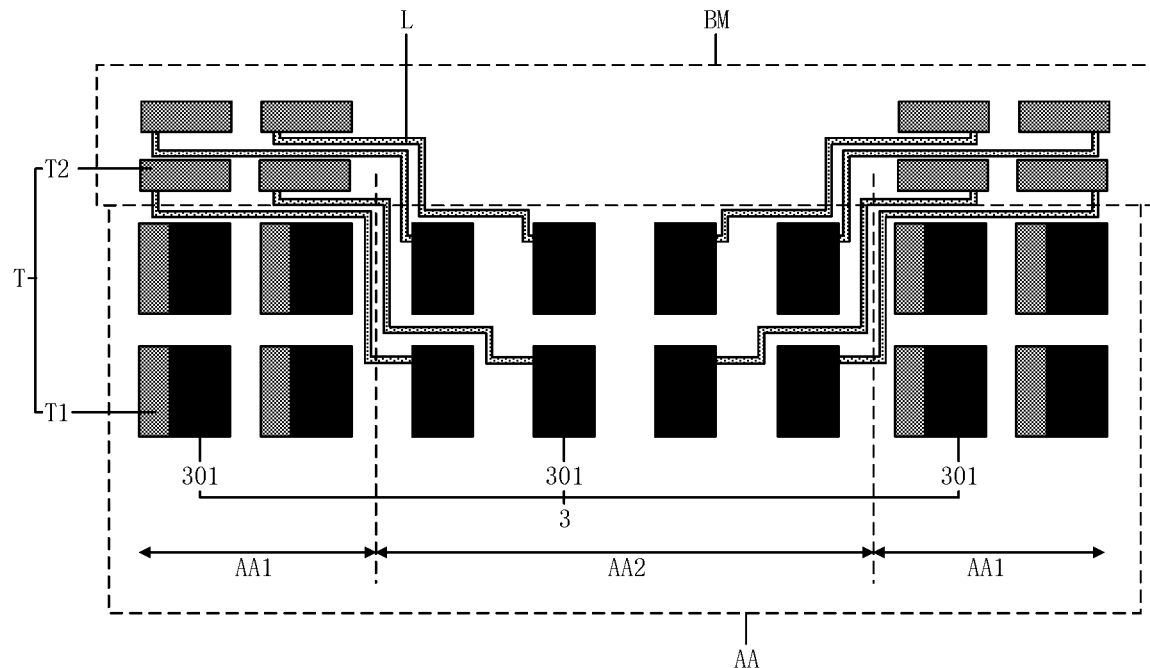
FIG. 6 is another schematic view showing the distribution of the anodes and the pixel driving circuitries of the array substrate according to one embodiment of the present disclosure.

In a possible embodiment of the present disclosure, as shown in FIG. 6, the array substrate further includes a bezel region BM surrounding the display region, the pixel driving circuitries T include a plurality of first pixel driving circuitries T1 arranged at the non-opening region AA1 and a plurality of second pixel driving circuitries T2 arranged at the bezel region BM, each anode 301 at the non-opening region AA1 is electrically coupled to one first pixel driving circuitry T1, and each anode 301 at the opening region AA2 is electrically coupled to one second pixel driving circuitry T2 via the transparent line L.

In the embodiments of the present disclosure, the second pixel driving circuitry T2 is arranged at the bezel region BM, i.e., merely the anode 301 is arranged at the opening region AA2. The anode 301 at the opening region AA2 is electrically coupled to the corresponding second pixel driving circuitry T2 via the transparent line L. In this way, it is able to ensure the area of the light-transmitting region of the opening region AA2 without reducing the area of the anode 301, thereby to meet the requirement on the light-transmitting effect of the opening region AA2.

Figure 7:
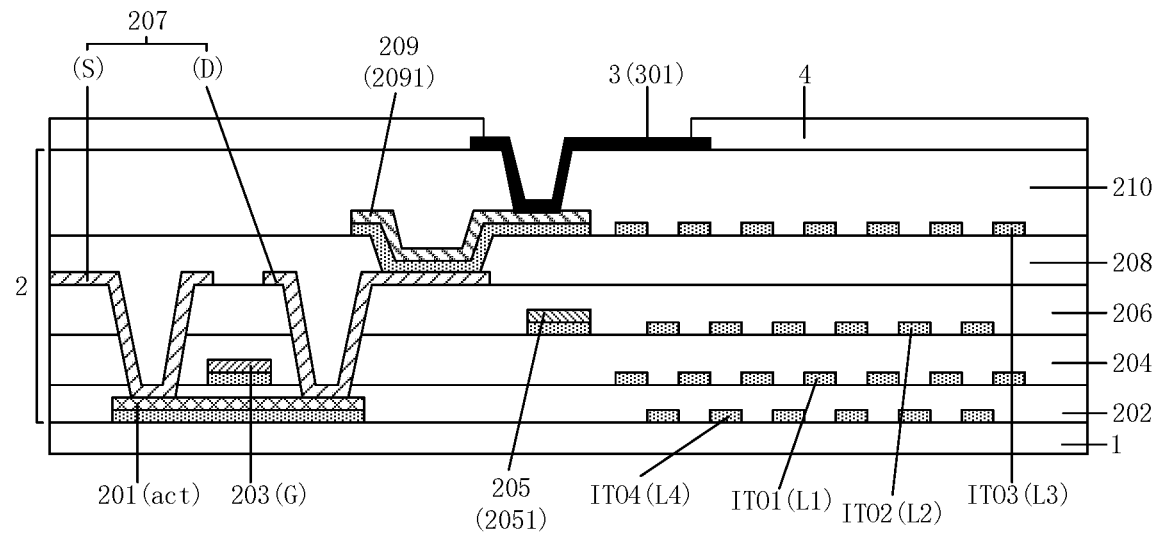
FIG. 7 is still yet another schematic view showing the film layers of the array substrate according to one embodiment of the present disclosure.

In a possible embodiment of the present disclosure, as shown in FIG. 7, the at least one transparent conductive layer includes the first transparent conductive layer ITO1, the second transparent conductive layer ITO2 and the third transparent conductive layer ITO3, and the transparent line L includes one or more of the first transparent line L1, the second transparent line L2 and the third transparent line L3.

In another possible embodiment of the present disclosure, as shown in FIG. 7, the at least one transparent conductive layer ITO further includes a fourth transparent conductive layer ITO4 arranged between the base substrate 1 and the active layer 201 and including a fourth transparent line L4. The transparent line L includes one or more of the first transparent line L1, the second transparent line L2, the third transparent line L3 and the fourth transparent line L4, and a plurality of transparent lines in the first transparent line L1, the second transparent line L2, the third transparent line L3 and the fourth transparent line L4 is electrically coupled to each other through a via-hole to form the transparent line L.

It should be appreciated that, FIGS. 3 to 5 and 7 merely show the driving transistor.

It should be further appreciated that, the anode at the opening region is electrically coupled to the corresponding driving circuitry via the first transparent conductive layer ITO1, the second transparent conductive layer ITO2, the third transparent conductive layer ITO3, and the fourth transparent conductive layer ITO4 in different ways, and merely one way is shown in FIG. 7.

In the embodiments of the present disclosure, four transparent conductive layers are provided, so as to ensure the light-transmitting effect of the opening region AA2 while providing a high PPI. During the implementation, depending on a specific wiring space and a wiring requirement, each anode 301 at the opening region AA2 is electrically coupled to the corresponding second pixel driving circuitry T2 via the transparent line L1 formed by one or more transparent conductive layers.

It should be appreciated that, an extension direction of a line at each transparent conductive layer should be consistent with an extension direction of a line at the metal layer with a same mask as possible. For example, an extension direction of the first transparent line is identical to an extension direction of a gate line at the first gate metal layer, so as to ensure the wiring rationality as well as the compatibility of the mask.

In order to reduce the quantity of masks through designing the transparent conductive layer in such a manner as to be laminated on and in contact with the metal layer and/or the active layer, the following description will be given when the pixel driving circuitry for driving the anode at the opening region is arranged at the bezel region. Here, the transparent conductive layer merely includes the first transparent conductive layer ITO1 to the third transparent conductive layer ITO3.

Figure 8:
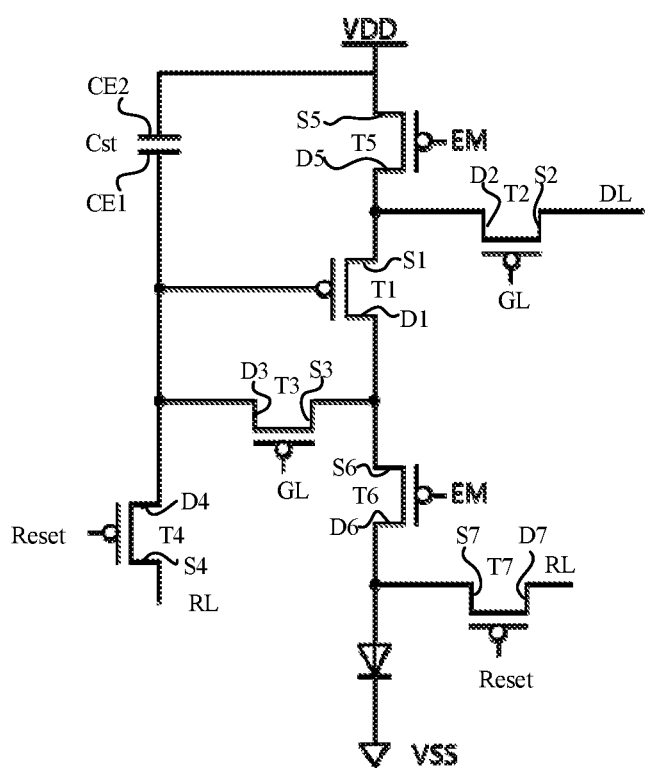
FIG. 8 is an equivalent circuit diagram of a pixel driving circuitry in the related art.

FIG. 8 is an equivalent circuit diagram of a conventional 7T1C-based pixel driving circuitry. A first transistor T1 is just the above-mentioned driving transistor, S1 is a source electrode of the driving transistor (corresponding to S in FIGS. 3 to 5 and 7), and D1 is the drain electrode of the driving transistor (corresponding to D in FIGS. 3 to 5 and 7). In the pixel driving circuitry as shown in FIG. 8, a second transistor T2 and a third transistor T3 are used for writing data, a fourth transistor T4 and a seventh transistor T7 are used for resetting a voltage, and a fifth transistor T5 and a sixth transistor T6 are used for light-emission control.

Figure 9:
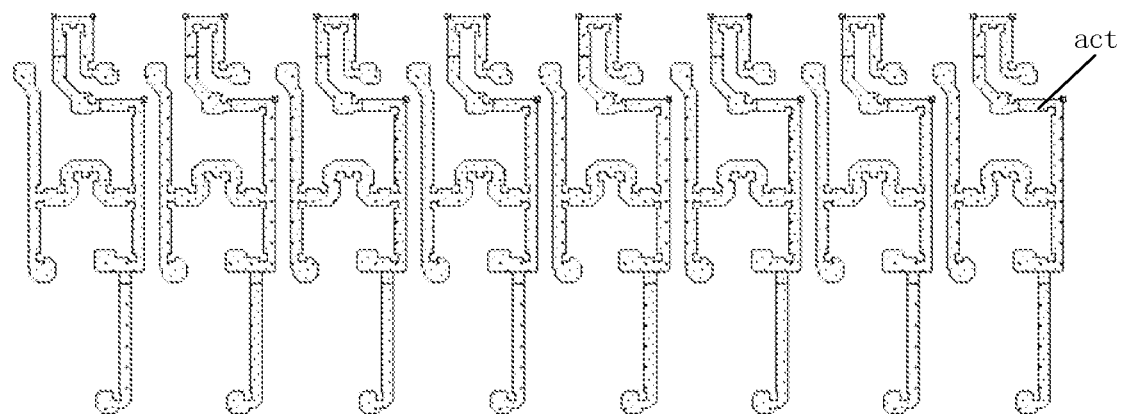
FIG. 9 is a topical top view of an active layer.

For the pixel driving circuitry as shown in FIG. 8, FIG. 9 shows a topical pattern design of the active layer. It should be appreciated that, for the active layer in FIG. 9, each active island act corresponds to seven transistors of the pixel driving circuitry in FIG. 8. Through the design of a quantum injection position of the active island act in FIG. 9, the active island act is divided to the first transistor T1 to the seventh transistor T7 in the pixel driving circuitry in FIG. 8.

Figure 10:
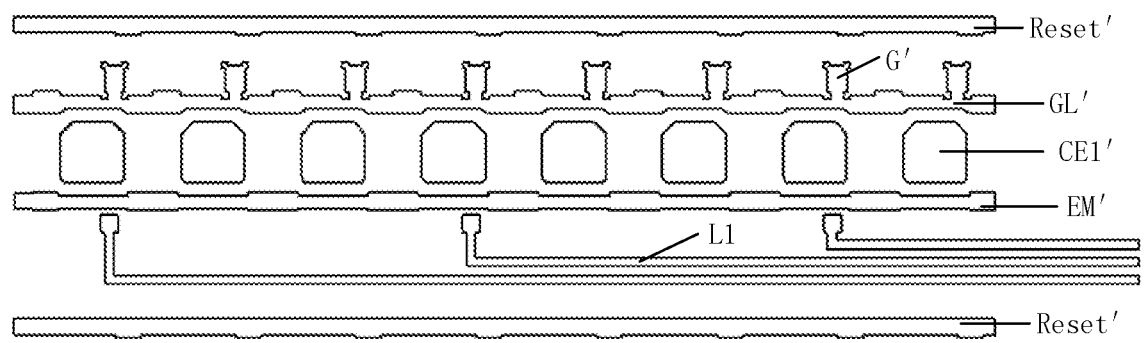
FIG. 10 is a topical top view of a first transparent conductive layer according to one embodiment of the present disclosure.
Figure 11:
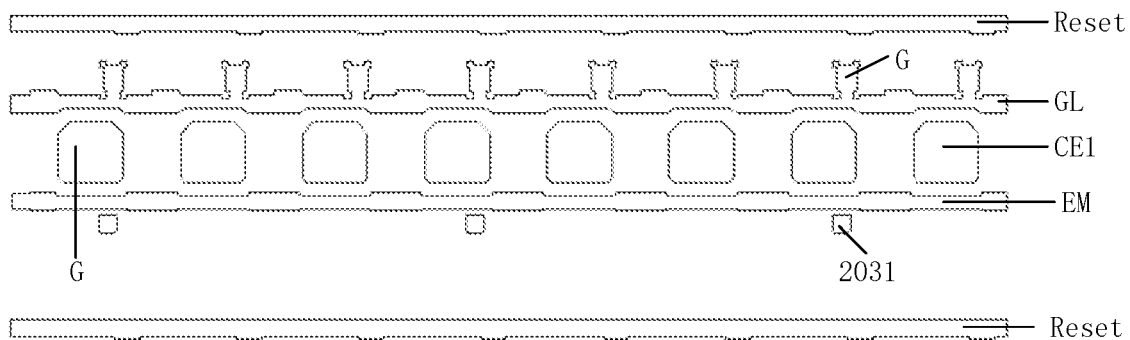
FIG. 11 is a topical top view of a first gate metal layer according to one embodiment of the present disclosure.

FIG. 10 is a topical schematic view of the first transparent conductive layer, and FIG. 11 is a topical schematic view of the first gate metal layer. In the embodiments of the present disclosure, the first transparent conductive layer is arranged below the first gate metal layer, i.e., the first gate metal layer is arranged at a side of the first transparent conductive layer away from the base substrate, so the first gate metal layer includes a first electrode CE1 of a storage capacitor, a resetting scanning line Reset, a gate electrode G, a gate line GL, a light-emission scanning line EM, a first lapping structure 2031 and a second lapping structure 2032 (not shown in FIG. 11). Based on the above, apart from the first transparent line L1, the first transparent conductive layer further includes patterns covered by the patterned first gate metal layer, including a portion CE1' covered by the first electrode of the storage capacitor, a portion Reset' covered by the resetting scanning line, a portion G' covered by the gate electrode, a portion GL' covered by the gate line and a portion EM' covered by the light-emission scanning line.

Figure 12:
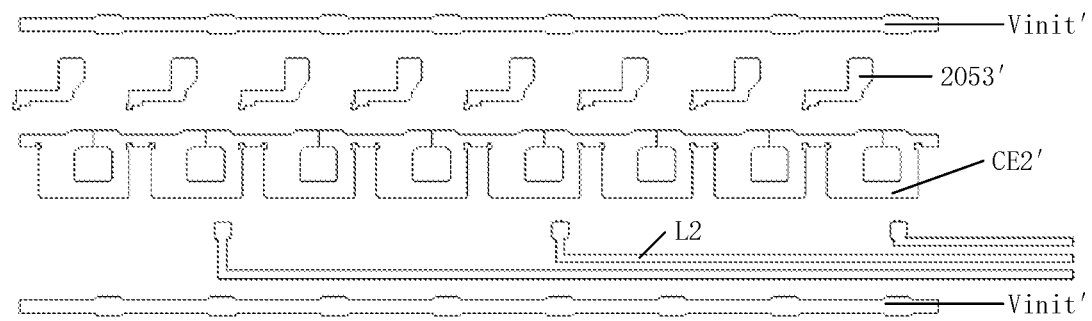
FIG. 12 is a topical top view of a second transparent conductive layer according to one embodiment of the present disclosure.
Figure 13:
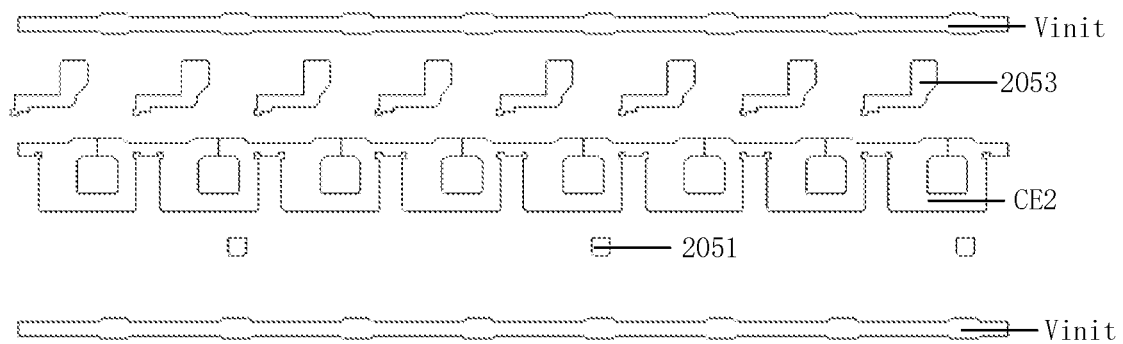
FIG. 13 is a topical top view of a second gate metal layer according to one embodiment of the present disclosure.

FIG. 12 is a topical schematic view of the second transparent conductive layer and FIG. 13 is a topical schematic view of the second gate metal layer. In the embodiments of the present disclosure, the second transparent conductive layer is arranged below the second gate metal layer, i.e., the second gate metal layer is arranged at a side of the second transparent conductive layer away from the base substrate. The second gate metal layer includes an initialization signal line Vinit, a second electrode CE2 of the storage capacitor, the third lapping structure 2051, the fourth lapping structure 2052 (not shown in FIG. 13) and a first adaptation structure 2053. Based on the above, apart from the second transparent line L2, the second transparent conductive layer further includes patterns covered by the patterned first gate metal layer, including a portion Vinit' covered by the initialization signal line, a portion CE2' covered by the second electrode of the storage capacitor, and a portion 2053' covered by the first adaptation structure.

Figure 14:
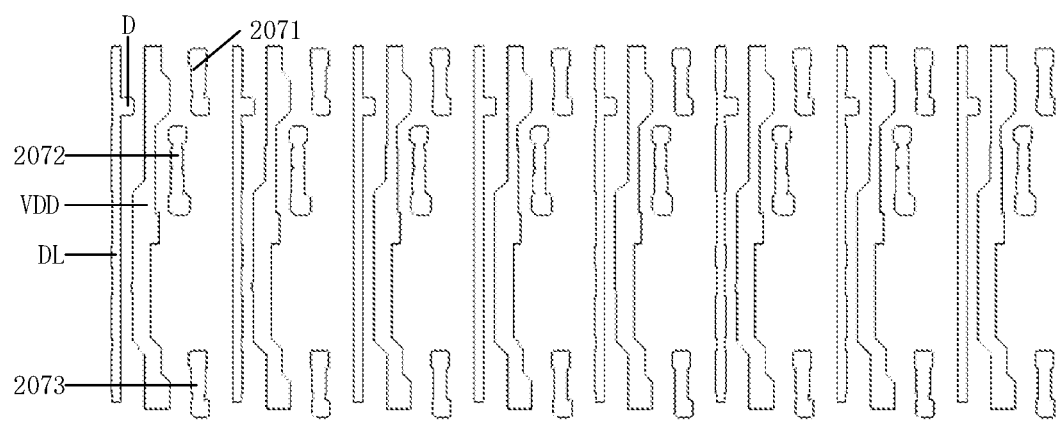
FIG. 14 is a topical top view of a first source/drain metal layer according to one embodiment of the present disclosure.

FIG. 14 is a topical schematic view of the first source/drain metal layer. The first source/drain metal layer includes a data line DL, the drain electrode D, a power source signal line VDD, the fifth lapping structure 2071, a second adaptation structure 2072 and a third adaptation structure 2073.

Figure 15:
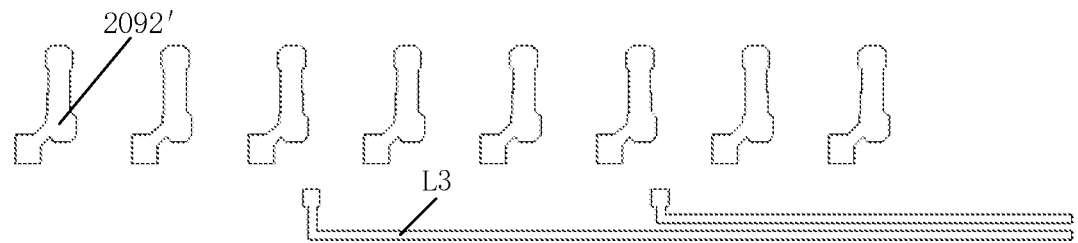
FIG. 15 is a topical top view of a third transparent conductive layer according to one embodiment of the present disclosure.
Figure 16:
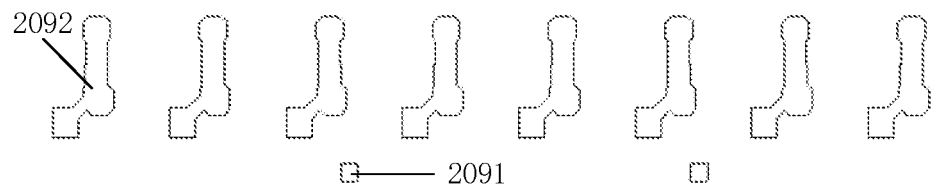
FIG. 16 is a topical top view of a second source/drain metal layer according to one embodiment of the present disclosure.

FIG. 15 is a topical schematic view of the third transparent conductive layer and FIG. 16 is a topical schematic view of the second source/drain metal layer. In the embodiments of the present disclosure, the second source/drain metal layer includes a fourth adaptation structure 2092 and a sixth lapping structure 2091. Based on the above, the third transparent conductive layer includes a portion 2092' covered by the fourth adaptation structure and the third transparent line L3.

Based on the description about FIGS. 9 to 16, when the transparent conductive layer is laminated on and in contact with one metal layer, it is able to pattern the transparent conductive layer and the metal layer through a same mask.

Further, in order to balance a resistance, a position of a film layer where the transparent conductive layer is located and a distance between the anode at the opening region and the corresponding second pixel driving circuitry shall be taken into consideration.

To be specific, the anodes at the opening region are spaced apart from the second pixel driving circuitries at the bezel region at different distances. An anode spaced apart from a corresponding second pixel driving circuitry at the bezel region by a distance d1 is electrically coupled to the corresponding second pixel driving circuitry through the first transparent conductive layer laminated on and in contact with the first gate metal layer, an anode spaced apart from a corresponding second pixel driving circuitry at the bezel region by a distance d2 is electrically coupled to the corresponding second pixel driving circuitry through the second transparent conductive layer laminated on and in contact with the second gate metal layer, and an anode spaced apart from a corresponding third pixel driving circuitry at the bezel region by a distance d3 is electrically coupled to the corresponding second pixel driving circuitry through the third transparent conductive layer laminated on and in contact with the second source/drain metal layer, where d1<d2<d3. In other words, when the anode at the opening region is spaced apart from the second pixel driving circuitry at the bezel region by a smaller distance (in a plane parallel to the base substrate), the anode is electrically coupled to the corresponding second pixel driving circuitry via the transparent conductive layer spaced apart from the anode by a larger distance in a direction perpendicular to the base substrate.

It should be appreciated that, the topical structure of the film layers in FIGS. 9 to 16 are for illustrative purposes only, and during the implementation, the signal lines and the adaptation structures at each film layer may be adjusted according to the practical need, which will not be particularly defined herein.

Figure 17:
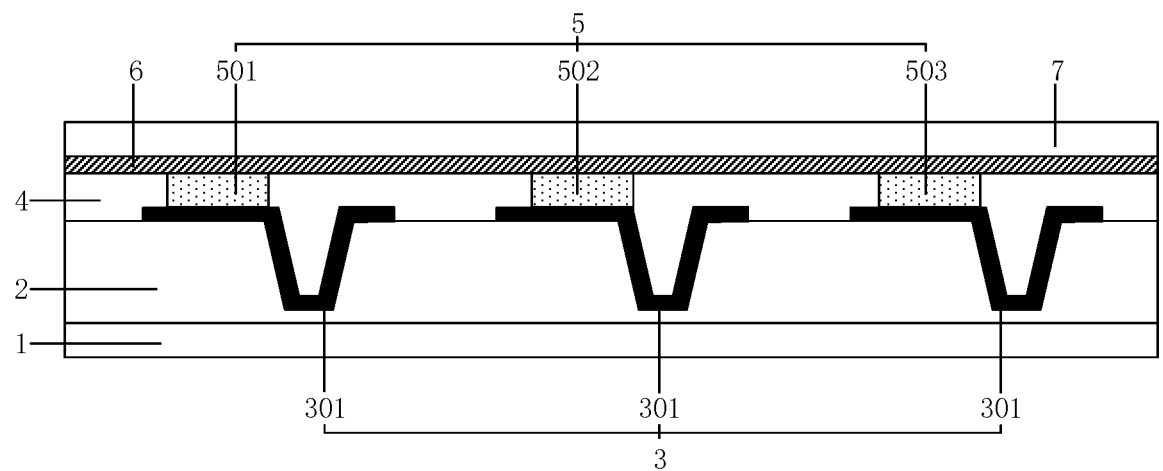
FIG. 17 is a schematic view showing a display panel according to one embodiment of the present disclosure.

Based on a same inventive concept, the present disclosure further provides in some embodiments a display panel I which, as shown in FIG. 17, includes the above-mentioned array substrate. The display panel has the above-mentioned beneficial effect of the array substrate, which will not be particularly defined herein.

To be specific, in the embodiments of the present disclosure, the display panel I further includes an organic light-emitting layer 5, a cathode layer 6 and an encapsulation layer 7, which will not be particularly defined herein.

To be specific, in the embodiments of the present disclosure, the display panel I further includes an optical adhesive layer, a polarizer and a cover plate, which will not be particularly defined herein.

Figure 18:
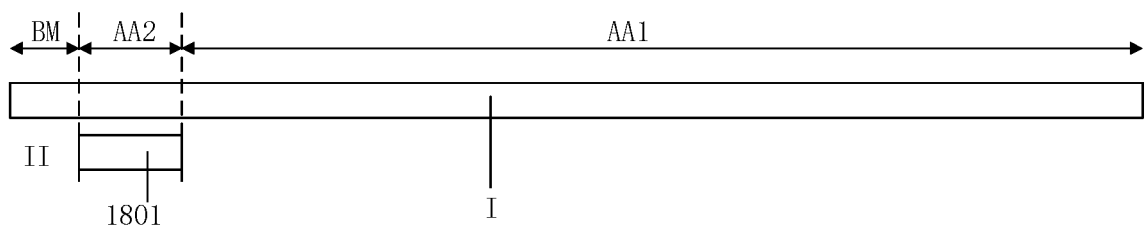
FIG. 18 is a schematic view showing a display device according to one embodiment of the present disclosure.

Based on a same inventive concept, the present disclosure further provides in some embodiments a display device II which, as shown in FIG. 18, includes the above-mentioned display panel I. The display device has the above-mentioned beneficial effect of the display panel I, which will not be particularly defined herein.

To be specific, the display device II further includes an image collector 1801 (e.g., an optical sensor such as a camera or an infrared sensor), and an orthogonal projection of the image collector onto the display panel I is located at the opening region AA2.

Figure 19:
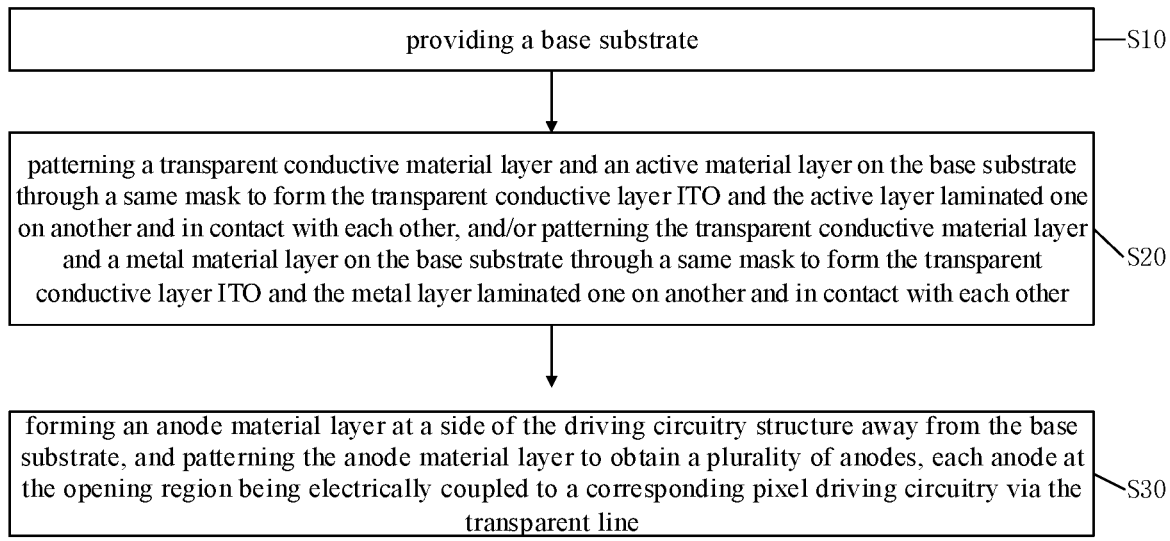
FIG. 19 is a flow chart of a method for manufacturing the array substrate according to one embodiment of the present disclosure.

Based on a same inventive concept, the present disclosure provides in some embodiments a method for manufacturing an array substrate. The array substrate includes a driving circuitry structure, and the driving circuitry structure includes at least one transparent conductive layer for forming a transparent line, and an active layer 201 and a plurality of metal layers for forming a plurality of pixel driving circuitries. The array substrate includes a display region AA, the display region AA includes an opening region AA2. As shown in FIG. 19 in conjunction with FIGS. 1 to 7, the method includes the following steps, i.e., S10, S20 and S30.

S10, providing a base substrate 1.

S20, patterning a transparent conductive material layer and an active material layer on the base substrate through a same mask to form the transparent conductive layer ITO and the active layer laminated one on another and in contact with each other, and/or patterning the transparent conductive material layer and a metal material layer on the base substrate through a same mask to form the transparent conductive layer ITO and the metal layer laminated one on another and in contact with each other.

S30, forming an anode material layer at a side of the driving circuitry structure 2 away from the base substrate 1, and patterning the anode material layer to obtain a plurality of anodes 301. Each anode 301 at the opening region AA2 is electrically coupled to a corresponding pixel driving circuitry T via the transparent line L.

According to the method for manufacturing the array substrate in the embodiments of the present disclosure, the transparent line L through which each anode 301 at the opening region AA2 is electrically coupled to the corresponding pixel driving circuitry T is laminated on and in contact with the active layer 201 and/or the metal layer, so that the transparent line L and the active layer 201 and/or the metal layer are patterned through a same mask. As a result, it is able to reduce the quantity of masks, thereby to reduce the manufacture cost as well as the production takt.

Figure 20:
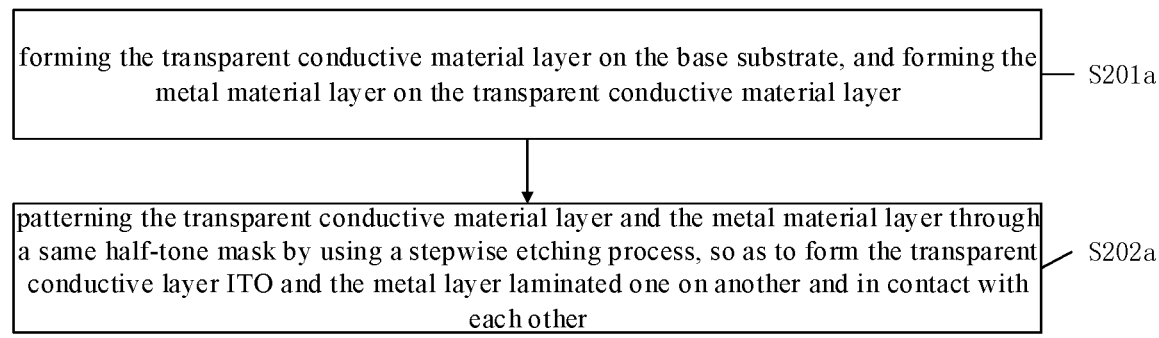
FIG. 20 is a flow chart of S2 in FIG. 19.

In a possible embodiment of the present disclosure, as shown in FIG. 20 in conjunction with FIGS. 1 to 7, the plurality of metal layers includes a first gate metal layer 203, a second gate metal layer 205, a first source/drain metal layer 207 and a second source/drain metal layer 209 laminated one on another on the base substrate 1 in a direction from the base substrate to the anode layer 301. Each pixel driving circuitry T includes a driving transistor, the first source/drain metal layer 207 includes a drain electrode of the driving transistor in electrical contact with the active layer, and each anode 301 at the opening region AA2 is electrically coupled to the drain electrode of the driving transistor or the active layer of the corresponding pixel driving circuitry T via the transparent line L.

Based on the above, the patterning the transparent conductive material layer and the metal material layer on the base substrate through the same mask to form the transparent conductive layer ITO and the metal layer laminated one on anther and in contact with each other includes the following steps, i.e., S201a and S202a.

S201a, forming the transparent conductive material layer on the base substrate 1, and forming the metal material layer on the transparent conductive material layer.

S202a, patterning the transparent conductive material layer and the metal material layer through a same half-tone mask by using a stepwise etching process, so as to form the transparent conductive layer ITO and the metal layer laminated one on another and in contact with each other.

To be specific, the mask is a half-tone mask, and the stepwise etching process refers to a process where two or more etching steps are used to pattern the metal layer and the transparent conductive layer ITO laminated one on another and in contact with each other. For example, the transparent conductive material layer and the metal material layer are etched through a dry-etching process to obtain a pattern where the transparent conductive material layer overlaps the metal material layer, and then a part of the metal material layer arranged above the transparent conductive material layer (at a side away from the base substrate) and not to be reserved is removed through a wet-etching process.

An exposing process with the half-tone mask may refer to that in the related and thus will not be particularly defined herein.

It should be appreciated that, the masks for patterning different metal layers and the corresponding transparent conductive layers ITO laminated one on another and in contact with each other are different.

To be specific, the at least one transparent conductive layer ITO includes a first transparent conductive layer ITO1 laminated on and in contact with the first gate metal layer 203, and/or a second transparent conductive layer ITO2 laminated on and in contact with the second gate metal layer 205, and/or a third transparent conductive layer ITO3 laminated on and in contact with the second source/drain metal layer 209. After patterning the transparent conductive material layers, the first transparent conductive layer ITO1 includes a first transparent line L1, the second transparent conductive layer ITO2 includes a second transparent line L2, and the third transparent conductive layer ITO3 includes a third transparent line L3. The transparent line L includes one or more of the first transparent line L1, the second transparent line L2 and the third transparent line L3.

To be specific, how the anode 301 at the opening region AA2 is electrically coupled to the drain electrode of the driving transistor of the corresponding pixel driving circuitry T via one or more of the first transparent line L1, the second transparent line L2 and the third transparent line L3 may refer to that mentioned hereinabove, and thus will not be particularly defined herein.

In the embodiments of the present disclosure, the anode 301 at the opening region AA2 is electrically coupled to the corresponding pixel driving circuitry T through the transparent line L at the transparent conductive layer ITO laminated on and in contact with the metal layer, and the transparent conductive layer ITO and the metal layer may be etched through a same mask, i.e., no additional mask is required, so it is able to control the manufacture cost.

Based on the above, the transparent conductive layer ITO is laminated on and in contact with the metal layer, so as to enable the anode 301 at the opening region AA2 to be electrically coupled to the corresponding pixel driving circuitry T, thereby to meet the requirement on the PPI in a scheme of reducing the area of the anode 301 at the opening region AA2. For a scheme where the pixel driving circuitry T for driving the anode 301 at the opening region AA2 is arranged at the bezel region BM, the transparent line L is relatively long, so it is able to meet the wiring requirement on the transparent line L in the case of a low PPI, but for a display panel with a high PPI, it is insufficient to meet the wiring requirement on the transparent line L. The above two schemes will be described hereinafter in details.

In a possible embodiment of the present disclosure, for the scheme of reducing the area of the anode 301 at the opening region AA2, the display region AA further includes a normal display region AA1, and an area of the anode 301 at the normal display region AA1 is greater than an area of the anode 301 at the opening region AA2.

In a possible embodiment of the present disclosure, the pixel driving circuitries T include a plurality of first pixel driving circuitries T1 and a plurality of second pixel driving circuitries T2 arranged at the normal display region AA1, each anode 301 at the normal display region AA1 is electrically coupled to one first pixel driving circuitry T1, each anode 301 at the opening region AA2 is electrically coupled to one second pixel driving circuitry T2 via the transparent line L, and the transparent line L includes one or more of the first transparent line L1, the second transparent line L2 and the third transparent line L3.

The method for manufacturing the array substrate in the embodiments of the present disclosure is adapted to the scheme of reducing the area of the anode 301 at the opening region AA2. The anode 301 at the opening region AA2 is electrically coupled to the drain electrode of the driving transistor of the corresponding second pixel driving circuitry T2 through the transparent line L, so it is able for the anode 301 at the opening region AA2 to be electrically coupled to the corresponding second pixel driving circuitry T2. In addition, the transparent line L is formed through one or more transparent conductive layers ITO depending on the requirement on the PPI, and when a plurality of transparent conductive layers ITO is adopted, it is able to increase the PPI. The transparent conductive layer ITO is laminated on and in contact with the metal layer, and they may be etched through a same mask, i.e., no additional mask is required, so it is able to control the manufacture cost.

In another possible embodiment of the present disclosure, for the scheme where the second pixel driving circuitry T2 for driving the anode 301 at the opening region AA2 is arranged at the bezel region BM, the display region AA further includes the normal display region AA1, the array substrate further includes the bezel region BM, and the pixel driving circuitries T include a plurality of first pixel driving circuitries T1 arranged at the normal display region AA1 and a plurality of second pixel driving circuitries T2 arranged at the bezel region BM. Each anode 301 at the normal display region AA1 is electrically coupled to one first pixel driving circuitry T1, and each anode 301 at the opening region AA2 is electrically coupled to one second pixel driving circuitry T2 via the transparent line L.

Figure 21:
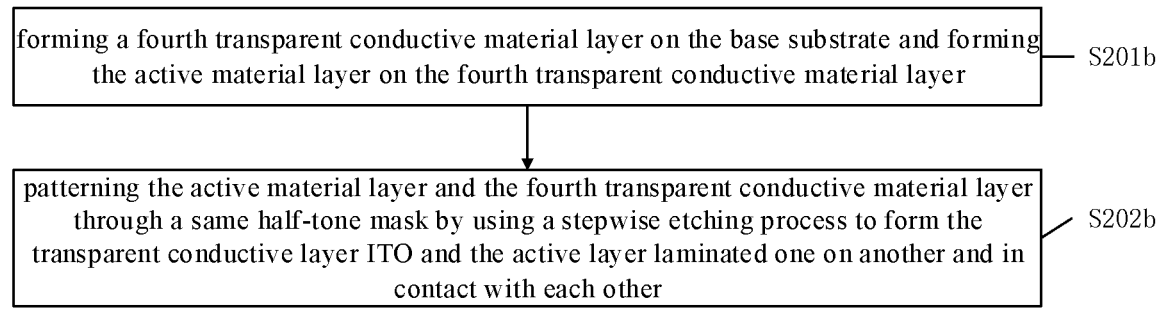
FIG. 21 is another flow chart of S2 in FIG. 19.

As shown in FIG. 21 in conjunction with FIGS. 1 to 7, the patterning the transparent conductive material layer and the active material layer on the base substrate through the same mask to form the transparent conductive layer and the active layer laminated one on another and in contact with each other includes the following steps, i.e., S201b and S202b.

S201b, forming a fourth transparent conductive material layer on the base substrate 1 and forming the active material layer on the fourth transparent conductive material layer.

S202b, patterning the active material layer and the fourth transparent conductive material layer through a same half-tone mask by using a stepwise etching process to form the transparent conductive layer ITO and the active layer 201 laminated one on another and in contact with each other.

To be specific, the mask is a half-tone mask, and the stepwise etching process refers to a process where a plurality of etching steps is used to pattern the active layer 201 and the fourth transparent conductive layer ITO4 laminated one on another and in contact with each other.

It should be appreciated that, the mask for patterning the active layer 201 and the fourth transparent conductive layer ITO4 laminated one on another and in contact with each other is different from the mask for patterning the metal layer and the transparent conductive layer ITO laminated one on another and in contact with each other, i.e., different masks are designed according to a specific patterning requirement.

The patterned fourth transparent conductive layer ITO includes a fourth transparent line L. The transparent line L includes one or more of the first transparent line L1, the second transparent line L2, the third transparent line L3 and the fourth transparent line L4, and a plurality of transparent lines in the first transparent line L1, the second transparent line L2, the third transparent line L3 and the fourth transparent line L4 is electrically coupled to each other through a via-hole to form the transparent line L.

Through the additional fourth transparent conductive layer ITO4 laminated on and in contact with the active layer 201, it is able to improve the wiring of the transparent line L, thereby to increase the PPI. In addition, the fourth transparent conductive layer ITO4 and the active layer 201 are patterned through a same mask, i.e., no additional mask is required, so it is able to control the manufacture cost.

The present disclosure at least has the following beneficial effects.

According to the array substrate, the method for manufacturing the array substrate, the display panel and the display device in the embodiments of the present disclosure, the transparent line through which each anode at the opening region is electrically coupled to the corresponding pixel driving circuitry is laminated on and in contact with the active layer and/or the metal layer, so that the transparent line and the active layer and/or the metal layer are patterned through a same mask. As a result, it is able to reduce the quantity of masks, thereby to reduce the manufacture cost as well as the production takt.

It should be appreciated that, steps, measures and schemes in various operations, methods and processes that have already been discussed in the embodiments of the present disclosure may be replaced, modified, combined or deleted.

In a possible embodiment of the present disclosure, the other steps, measures and schemes in various operations, methods and processes that have already been discussed in the embodiments of the present disclosure may also be replaced, modified, rearranged, decomposed, combined or deleted. In another possible embodiment of the present disclosure, steps, measures and schemes in various operations, methods and processes that are known in the related art and have already been discussed in the embodiments of the present disclosure may also be replaced, modified, rearranged, decomposed, combined or deleted.

It should be further appreciated that, such words as "center", "on", "under", "front", "back", "left", "right", "vertical", "horizontal", "top", "bottom", "inner" and "outer" are used to indicate directions or positions as viewed in the drawings, and they are merely used to facilitate the description in the present disclosure, rather than to indicate or imply that a device or member must be arranged or operated at a specific position.

In addition, such words as "first" and "second" may merely be adopted to differentiate different features rather than to implicitly or explicitly indicate any number or importance, i.e., they may be adopted to implicitly or explicitly indicate that there is at least one said feature. Further, such a phrase as "a plurality of" may be adopted to indicate that there are two or more features, unless otherwise specified.

Unless otherwise specified, such words as "arrange" and "connect" may have a general meaning, e.g., the word "connect" may refer to fixed connection, removable connection or integral connection, or mechanical or electrical connection, or direct connection or indirect connection via an intermediate component, or communication between two components, or wired or wireless communication connection. The meanings of these words may be understood by a person skilled in the art in accordance with the practical applications.

In the above description, the features, structures, materials or characteristics may be combined in any embodiment or embodiments in an appropriate manner.

It should be further appreciated that, although with arrows, the steps in the flow charts may not be necessarily performed in an order indicated by the arrows. Unless otherwise defined, the order of the steps may not be strictly defined, i.e., the steps may also be performed in another order. In addition, each of at least parts of the steps in the flow charts may include a plurality of sub-steps or stages, and these sub-steps or stages may not be necessarily performed at the same time, i.e., they may also be performed at different times. Furthermore, these sub-steps or stages may not be necessarily performed sequentially, and instead, they may be performed alternately with the other steps or at least parts of sub-steps or stages of the other steps.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An array substrate, comprising a display region, wherein the display region comprises an opening region, and the array substrate comprises:
    a base substrate;
    a driving circuitry structure comprising a transparent conductive layer for forming a transparent line, and an active layer and a plurality of metal layers for forming a plurality of pixel driving circuitries, the transparent conductive layer being laminated on and in contact with the active layer, and/or the transparent conductive layer being laminated on and in contact with one metal layer; and
    an anode layer arranged at a side of the driving circuitry structure away from the base substrate and comprising a plurality of anodes, each anode arranged at the opening region being electrically coupled to a corresponding pixel driving circuitry via the transparent line;
    wherein the plurality of metal layers comprises a first gate metal layer arranged at a side of the active layer away from the base substrate, a second gate metal layer arranged at a side of the first gate metal layer away from the active layer, a first source/drain metal layer arranged at a side of the second gate metal layer away from the first gate metal layer, and a second source/drain metal layer arranged at a side of the first source/drain metal layer away from the second gate metal layer; and
    the driving circuitry structure further comprises a first insulation layer arranged between the active layer and the first gate metal layer, a second insulation layer arranged between the first gate metal layer and the second gate metal layer, a third insulation layer arranged between the second gate metal layer and the first source/drain metal layer, a fourth insulation layer arranged between the first source/drain metal layer and the second source/drain metal layer, and a fifth insulation layer arranged between the second source/drain metal layer and the anode layer.

2. The array substrate according to claim 1, wherein each pixel driving circuitry comprises a driving transistor, the first source/drain metal layer comprises a drain electrode of the driving transistor in electrical contact with the active layer, and the anode at the opening region is electrically coupled to the drain electrode of the driving transistor or the active layer of the corresponding pixel driving circuitry via the transparent line;
    the at least one transparent conductive layer comprises a first transparent conductive layer laminated on and in contact with the first gate metal layer, and/or a second transparent conductive layer laminated on and in contact with the second gate metal layer, and/or a third transparent conductive layer laminated on and in contact with the second source/drain metal layer;
    the first transparent conductive layer comprises a first transparent line, the second transparent conductive layer comprises a second transparent line, and the third transparent conductive layer comprises a third transparent line; and
    the transparent line comprises one or more of the first transparent line, the second transparent line and the third transparent line.

3. The array substrate according to claim 2, wherein the first gate metal layer is arranged at a side of the first transparent conductive layer away from the base substrate, the second gate metal layer is arranged at a side of the second transparent conductive layer away from the base substrate, and the second source/drain metal layer is arranged at a side of the third transparent conductive layer away from the base substrate.

4. The array substrate according to claim 2, wherein the display region further comprises a non-opening region surrounding the opening region, and an area of an anode at the non-opening region is greater than an area of an anode at the opening region.

5. The array substrate according to claim 2, wherein the pixel driving circuitries comprise a plurality of first pixel driving circuitries and a plurality of second pixel driving circuitries arranged at the non-opening region, each anode at the non-opening region is electrically coupled to one first pixel driving circuitry, and each anode at the opening region is electrically coupled to one second pixel driving circuitry via the transparent line.

6. The array substrate according to claim 5, wherein the first gate metal layer comprises a first lapping structure and a second lapping structure each in electrical contact with the first transparent line, the first source/drain metal layer further comprises a fifth lapping structure, the drain electrode of the driving transistor is in contact with the first lapping structure, and the fifth lapping structure is electrically coupled to the anode and the second lapping structure; or, the second gate metal layer comprises a third lapping structure and a fourth lapping structure each in electrical contact with the second transparent line, the third lapping structure is further in contact with the drain electrode of the driving transistor, and the fourth lapping structure is electrically coupled to the anode; or, the second source/drain metal layer comprises a sixth lapping structure, the sixth lapping structure and the anode are in electrical contact with the third transparent line, and the sixth lapping structure is electrically coupled to the drain electrode of the driving transistor.

7. The array substrate according to claim 6, wherein orthogonal projections of the first lapping structure and the second lapping structure onto the base substrate fall within an orthogonal projection of the first transparent line onto the base substrate, orthogonal projections of the third lapping structure and the fourth lapping structure onto the base substrate fall within an orthogonal projection of the second transparent line onto the base substrate, and orthogonal projections of the sixth lapping structure and the anode onto the base substrate fall within an orthogonal projection of the third transparent line onto the base substrate.

8. The array substrate according to claim 2, wherein the display region further comprises a non-opening region surrounding the opening region, the array substrate further comprises a bezel region surrounding the display region, the pixel driving circuitries comprises a plurality of first pixel driving circuitries arranged at the non-opening region and a plurality of second pixel driving circuitries arranged at the bezel region, each anode at the non-opening region is electrically coupled to one first pixel driving circuitry, and each anode at the opening region is electrically coupled to one second pixel driving circuitry via the transparent line.

9. The array substrate according to claim 8, wherein the at least one transparent conductive layer further comprises a fourth transparent conductive layer arranged between the base substrate and the active layer and comprising a fourth transparent line, the transparent line comprises one or more of the first transparent line, the second transparent line, the third transparent line and the fourth transparent line, and a plurality of transparent lines in the first transparent line, the second transparent line, the third transparent line and the fourth transparent line is electrically coupled to each other through a via-hole to form the transparent line.

10. The array substrate according to claim 8, wherein an anode spaced apart from a corresponding second pixel driving circuitry at the bezel region by a distance d1 is electrically coupled to the second pixel driving circuitry through the first transparent conductive layer laminated on and in contact with the first gate metal layer, an anode spaced apart from a corresponding second pixel driving circuitry at the bezel region by a distance d2 is electrically coupled to the second pixel driving circuitry through the second transparent conductive layer laminated on and in contact with the second gate metal layer, and an anode spaced apart from a corresponding third pixel driving circuitry at the bezel region by a distance d3 is electrically coupled to the second pixel driving circuitry through the third transparent conductive layer laminated on and in contact with the second source/drain metal layer, where $d1<d2<d3$.

11. A display panel, comprising the array substrate according to claim 1.

12. A display device, comprising the display panel according to claim 11 and an image collector, wherein an orthogonal projection of the image collector onto the display panel is located at the opening region.

13. A method for manufacturing an array substrate, wherein the array substrate comprises a driving circuitry structure, and the driving circuitry structure comprises at least one transparent conductive layer for forming a transparent line, and an active layer and a plurality of metal layers for forming a plurality of pixel driving circuitries, the array substrate comprises a display region, and the display region comprises an opening region, wherein the method comprises:

providing a base substrate;

patterning a transparent conductive material layer and an active material layer on the base substrate through a same mask to form the transparent conductive layer and the active layer laminated one on another and in contact with each other, and/or patterning the transparent conductive material layer and a metal material layer on the base substrate through a same mask to form the transparent conductive layer and the metal layer laminated one on another and in contact with each other; and forming an anode material layer at a side of the driving circuitry structure away from the base substrate, and patterning the anode material layer to obtain a plurality of anodes, each anode at the opening region being electrically coupled to a corresponding pixel driving circuitry via the transparent line;

wherein the plurality of metal layers comprises a first gate metal layer arranged at a side of the active layer away from the base substrate, a second gate metal layer arranged at a side of the first gate metal layer away from the active layer, a first source/drain metal layer arranged at a side of the second gate metal layer away from the first gate metal layer, and a second source/drain metal layer arranged at a side of the first source/drain metal layer away from the second gate metal layer; and the driving circuitry structure further comprises a first insulation layer arranged between the active layer and the first gate metal layer, a second insulation layer arranged between the first gate metal layer and the second gate metal layer, a third insulation layer arranged between the second gate metal layer and the first source/drain metal layer, a fourth insulation layer arranged between the first source/drain metal layer and the second source/drain metal layer, and a fifth insulation layer arranged between the second source/drain metal layer and the anode layer.

14. The method according to claim 13, wherein
- each pixel driving circuitry comprises a driving transistor, the first source/drain metal layer comprises a drain electrode of the driving transistor in electrical contact with the active layer, and each anode at the opening region is electrically coupled to the drain electrode of the driving transistor or the active layer of the corresponding pixel driving circuitry via the transparent line;
- the at least one transparent conductive layer comprises a first transparent conductive layer laminated on and in contact with the first gate metal layer, and/or a second transparent conductive layer laminated on and in contact with the second gate metal layer, and/or a third transparent conductive layer laminated on and in contact with the second source/drain metal layer;
- the first transparent conductive layer comprises a first transparent line, the second transparent conductive layer comprises a second transparent line, and the third transparent conductive layer comprises a third transparent line; and
- the transparent line comprises one or more of the first transparent line, the second transparent line and the third transparent line.

15. The method according to claim 14, wherein the patterning the transparent conductive material layer and the metal material layer on the base substrate through the same half-tone mask to form the transparent conductive layer and the metal layer laminated one on anther and in contact with each other comprises:
- forming the transparent conductive material layer and the metal material layer sequentially on the base substrate; and
- patterning the transparent conductive material layer and the metal material layer through a same half-tone mask by using a stepwise etching process, so as to form the transparent conductive layer and the metal layer laminated one on another and in contact with each other.

16. The method according to claim 14, wherein the display region further comprises a non-opening region surrounding the opening region, and an area of an anode at the non-opening region is greater than an area of an anode at the opening region.

17. The method according to claim 15, wherein the pixel driving circuitries comprise a plurality of first pixel driving circuitries and a plurality of second pixel driving circuitries arranged at the non-opening region, each anode at the non-opening region is electrically coupled to one first pixel driving circuitry, and each anode at the opening region is electrically coupled to one second pixel driving circuitry via the transparent line.

18. The method according to claim 14, wherein the display region further comprises a non-opening region surrounding the opening region, the array substrate further comprises a bezel region surrounding the display region, the pixel driving circuitries comprise a plurality of first pixel driving circuitries arranged at the non-opening region and a plurality of second pixel driving circuitries arranged at the bezel region, each anode at the non-opening region is electrically coupled to one first pixel driving circuitry, and each anode at the opening region is electrically coupled to one second pixel driving circuitry via the transparent line.

19. The method according to claim 18, wherein the patterning the transparent conductive material layer and the active material layer on the base substrate through the same mask to form the transparent conductive layer and the active layer laminated one on another and in contact with each other comprises:
- depositing a fourth transparent conductive material layer and the active material layer sequentially on the base substrate; and
- patterning the active material layer and the fourth transparent conductive material layer through a same half-tone mask by using a stepwise etching process to form the transparent conductive layer and the active layer laminated one on another and in contact with each other,
- wherein the patterned transparent conductive layer comprises a fourth transparent line, the transparent line comprises one or more of the first transparent line, the second transparent line, the third transparent line and the fourth transparent line, a plurality of transparent lines in the first transparent line, the second transparent line, the third transparent line and the fourth transparent line is electrically coupled to each other via a via-hole to form the transparent line.

* * * * *